United States Patent
Uesaka

(12) 
(10) Patent No.: US 10,651,823 B2
(45) Date of Patent: May 12, 2020

(54) FILTER DEVICE AND MULTIPLEXER

(71) Applicant: Murata Manufacturing Co., Ltd., Nagaokakyo-shi, Kyoto-fu (JP)

(72) Inventor: Kenichi Uesaka, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 56 days.

(21) Appl. No.: 16/183,773

(22) Filed: Nov. 8, 2018

(65) Prior Publication Data

US 2019/0165765 A1 May 30, 2019

(30) Foreign Application Priority Data

Nov. 27, 2017 (JP) .................................. 2017-226783

(51) Int. Cl.
| | |
|---|---|
| *H01P 1/10* | (2006.01) |
| *H03H 9/50* | (2006.01) |
| *H03H 9/60* | (2006.01) |
| *H03H 11/06* | (2006.01) |
| *H03H 11/34* | (2006.01) |
| *H03H 9/64* | (2006.01) |

(52) U.S. Cl.
CPC ............ *H03H 11/06* (2013.01); *H03H 9/605* (2013.01); *H03H 9/6483* (2013.01); *H03H 11/34* (2013.01); *H03H 2210/015* (2013.01); *H03H 2210/036* (2013.01)

(58) Field of Classification Search
CPC ..... H01P 1/10; H03H 9/46; H03H 9/50; H03H 9/60; H03H 9/605; H03H 9/64
USPC .......................... 333/101, 133, 187, 189, 193
See application file for complete search history.

(56) References Cited

U.S. PATENT DOCUMENTS

| | | | |
|---|---|---|---|
| 10,224,899 B2 * | 3/2019 | Tsukamoto | ............... H01P 1/20 |
| 10,382,009 B2 * | 8/2019 | Nosaka | ................... H04B 1/006 |
| 2016/0301383 A1 | 10/2016 | Tani | |
| 2018/0227008 A1 * | 8/2018 | Obiya | ..................... H03F 3/195 |
| 2019/0115947 A1 * | 4/2019 | Nosaka | .................... H04B 1/50 |

FOREIGN PATENT DOCUMENTS

| | | |
|---|---|---|
| JP | 3878714 B2 | 2/2007 |
| WO | 2015/099105 A1 | 7/2015 |

* cited by examiner

*Primary Examiner* — Dean O Takaoka
(74) *Attorney, Agent, or Firm* — Keating & Bennett, LLP

(57) ABSTRACT

A filter device includes a terminal, a switch that includes a common terminal and selection terminals and switches a connection of the common terminal to one of the selection terminals, a series arm resonator, and filter circuits. The filter circuits are connected to one end of the series arm resonator. The common terminal is connected to the terminal. One of the selection terminals is connected between one end of the series arm resonator and the filter circuits. Another one of the selection terminals is connected to the other end of the series arm resonator.

20 Claims, 5 Drawing Sheets

FILTER DEVICE AND MULTIPLEXER

CROSS REFERENCE TO RELATED APPLICATIONS

This application claims the benefit of priority to Japanese Patent Application No. 2017-226783 filed on Nov. 27, 2017. The entire contents of this application are hereby incorporated herein by reference.

BACKGROUND OF THE INVENTION

1. Field of the Invention

The present invention relates to a filter device and a multiplexer.

2. Description of the Related Art

A multiplexer is disclosed in which one input/output terminals of a plurality of filters having different pass bands are connected in common on the side of, for example, an antenna (see, for example, Japanese Patent No. 3878714. This can provide multi-band communication.

However, in the above-described multiplexer in the related art, the number of filters connected in common increases with the increase in the number of frequencies used for communication. This leads to the increase in the size of the multiplexer.

SUMMARY OF THE INVENTION

Preferred embodiments of the present invention provide filter devices and multiplexers that provide multi-band communication and are able to be reduced in size or miniaturized.

A filter device according to a preferred embodiment of the present invention includes a first input/output terminal, a first switch that includes a first common terminal and a plurality of first selection terminals and switches a connection of the first common terminal to one of the first selection terminals, a first series arm resonator, and at least one filter circuit. The at least one filter circuit is connected to one end of the first series arm resonator. The first common terminal is connected to the first input/output terminal. One of the first selection terminals is connected between the one end of the first series arm resonator and the at least one filter circuit. Another one of the first selection terminals is connected to another end of the first series arm resonator.

A high frequency signal input to or output from the first input/output terminal does not pass through the first series arm resonator but through the at least one filter circuit in a case in which the first common terminal and the first selection terminal, which is connected to the one end of the first series arm resonator (that is, between the first series arm resonator and the at least one filter circuit), by the first switch. On the other hand, the high frequency signal passes through the first series arm resonator and the at least one filter circuit in a case in which the first common terminal is connected to the first selection terminal connected to the other end of the first series arm resonator by the first switch. Accordingly, switching performed by the first switch causes the filter device to function as a filter (a first filter) including the first series arm resonator and the at least one filter circuit or a filter (a second filter) including the at least one filter circuit. In the first filter, at least the first series arm resonator is added to the components in the second filter and differs from the second filter in this point. Accordingly, the first filter and the second filter have different pass bands and switching performed by the first switch enables the multi-band communication of the filter device. Since the first filter and the second filter share the at least one filter circuit, the filter device is able to be further reduced in size as compared with a case in which the first filter and the second filter are separately provided. As a result, reduction in size or miniaturization and multi-band communication are achieved.

A filter device according to a preferred embodiment of the present invention may further include a second input/output terminal, a second switch that includes a second common terminal and a plurality of second selection terminals and switches a connection of the second common terminal to one of the second selection terminals, and a second series arm resonator. The at least one filter circuit may be connected between the first series arm resonator and one end of the second series arm resonator. The second common terminal may be connected to the second input/output terminal. One of the second selection terminals may be connected between the one end of the second series arm resonator and the at least one filter circuit. Another one of the second selection terminals may be connected to another end of the second series arm resonator.

Switching performed by the second switch causes a high frequency signal input to or output from the first input/output terminal to or not to pass through the second series arm resonator. Switching performed by the second switch is therefore able to change the number of elements through which the high frequency signal passes. As a result, frequencies that the filter device support are able to be flexibly changed.

One of a pass band defined by the at least one filter circuit and a pass band defined by the first series arm resonator and the at least one filter circuit may be inside the other one of the pass bands. Or, one of a pass band defined by the at least one filter circuit and a pass band defined by the first series arm resonator, the second series arm resonator, and the at least one filter circuit may be inside the other one of the pass bands.

Multi-band communication is provided in frequency bands having a relationship such as the relationship between Long Term Evolution (LTE) Band30Rx and LTE Band40 or the relationship between LTE Band1Rx and LTE Band66Rx in which one of the frequency bands (for example, LTE Band40) includes the other one of them (for example, LTE Band30Rx).

In a filter device according to a preferred embodiment of the present invention, the at least one filter circuit may include a series arm resonator and a parallel arm resonator.

Using a ladder configuration defined by the at least one filter circuit including a series arm resonator and a parallel arm resonator and the first series arm resonator, a pass band is able to be provided.

A multiplexer according to a preferred embodiment of the present invention includes a plurality of filters including filter devices according to a preferred embodiment of the present invention. Input/output terminals of the respective filters are directly or indirectly connected in common.

With this configuration, a multiplexer that provides multi-band communication and is able to be miniaturized is provided.

According to preferred embodiments of the present invention, filter devices and multiplexers that perform multi-band communication and are able to be reduced in size or miniaturized are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
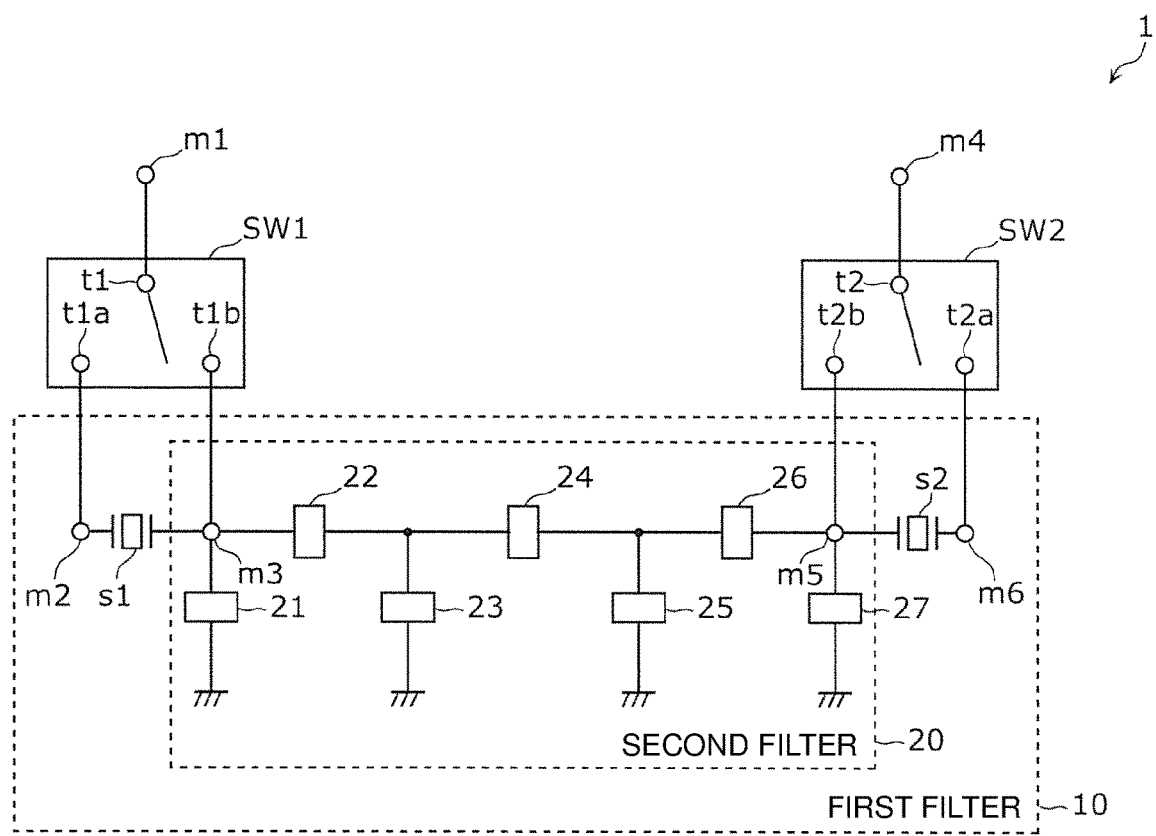
FIG. 1 is a diagram illustrating the circuit configuration of a filter device according to a preferred embodiment of the present invention.

Preferred embodiments of the present invention will be described in detail below with reference to the accompanying drawings. The preferred embodiments to be described below represent comprehensive or concrete examples. The numerical values, shapes, materials, components, the arrangement and connection state of the components to be described in the following preferred embodiments are merely examples, and are not intended to limit the present invention. Components not described in the independent claims among the components in the following preferred embodiments are described as optional components. In the drawings, the same reference numeral is used to represent the same or substantially the same configuration so as to avoid or simplify repeated explanation. In the following preferred embodiments, the expression of "being connected" means not only that components are directly connected to each other but also that the components are electrically connected to each other via another element.

The configuration of a filter device according to a preferred embodiment of the present invention will be described with reference to FIG. 1.

FIG. 1 is a diagram illustrating the circuit configuration of a filter device 1 according to a preferred embodiment of the present invention.

The filter device 1 provides multi-band communication. The filter device 1 includes a terminal m1 (first input/output terminal) and a terminal m4 (second input/output terminal). A high frequency signal input into the terminal m1 passes through, for example, a filter circuit in the filter device 1 and is output from the terminal m4. Alternatively, a high frequency signal input into the terminal m4 passes through, for example, a filter circuit in the filter device 1 and is output from the terminal m1. That is, each of the terminals m1 and m4 may be either of an input terminal and an output terminal.

The filter device 1 includes switches SW1 and SW2, series arm resonators s1 and s2, and at least one filter circuit. In the present preferred embodiment, the filter device 1 includes filter circuits 21 to 27.

The switch SW1 includes a common terminal t1 (first common terminal) and a plurality of selection terminals (first selection terminals), and corresponds to a first switch that switches the connection of the common terminal t1 to one of the selection terminals. In the present preferred embodiment, the switch SW1 includes two selection terminals t1a and t1b. The common terminal t1 is connected to the terminal m1.

The switch SW2 includes a common terminal t2 (second common terminal) and a plurality of selection terminals (second selection terminals), and corresponds to a second switch configured to switch the connection of the common terminal t2 to one of the selection terminals. In the present preferred embodiment, the switch SW2 includes two selection terminals t2a and t2b. The common terminal t2 is connected to the terminal m4.

Each of the switches SW1 and SW2 is, for example, an SPnP (single pole n-Throw: n is an integer greater than or equal to 2 and is preferably 2 in the present preferred embodiment) switch element defined by a semiconductor device. Specifically, each of the switches SW1 and SW2 is preferably a field effect transistor (FET) made of, for example, gallium arsenide (GaAs) or a complementary metal oxide semiconductor (CMOS). Since the switch defined by a semiconductor is small, the filter device 1 is able to be miniaturized. The switches SW1 and SW2 may be integral with or separate from the series arm resonators s1 and s2 and at least one filter circuit. For example, in a case in which they are separately provided, these components may be disposed on a single mounting board to provide a module structure.

Each of the switches SW1 and SW2 switches the connection of the common terminal to one of the two selection terminals in accordance with a control signal transmitted from a control unit (not illustrated), such as a radio frequency integrated circuit (RFIC), for example.

The series arm resonator s1 corresponds to a first series arm resonator one end of which is connected to the filter circuits 21 to 27. One of the selection terminals t1a and t1b is connected between the series arm resonator s1 and the filter circuits 21 to 27 on the side of one end of the series arm resonator s1. In the present preferred embodiment, a terminal m3 is provided on the side of one end of the series arm resonator s1. The selection terminal t1b is connected to the terminal m3 between the series arm resonator s1 and the filter circuits 21 to 27. The other one of the selection terminals t1a and t1b is connected to the other end of the series arm resonator s1. In the present preferred embodiment, a terminal m2 is provided on the side of the other end of the series arm resonator s1. The selection terminal t1a is connected to the terminal m2 on the side of the other end of the series arm resonator s1. Thus, the series arm resonator s1 is connected between the selection terminals t1a and t1b.

The series arm resonator s2 corresponds to a second series arm resonator, one end of which is connected to the filter circuits 21 to 27. One of the selection terminals t2a and t2b is connected between the series arm resonator s2 and the filter circuits 21 to 27 on the side of one end of the series arm resonator s2. In the present preferred embodiment, a terminal m5 is provided on the side of one end of the series arm resonator s2. The selection terminal t2b is connected to the terminal m5 between the series arm resonator s2 and the filter circuits 21 to 27. The other one of the selection terminals t2a and t2b is connected to the other end of the series arm resonator s2. In the present preferred embodiment, a terminal m6 is provided on the side of the other end of the series arm resonator s2. The selection terminal t2a is connected to the terminal m6 on the side of the other end of the series arm resonator s2. Thus, the series arm resonator s2 is connected between the selection terminals t2a and t2b.

Each of the series arm resonators s1 and s2 is preferably an acoustic wave resonator that uses an acoustic wave, and is, for example, a resonator that uses a surface acoustic wave (SAW), a resonator that uses a bulk acoustic wave (BAW), or a film bulk acoustic resonator (FBAR). Examples of a SAW include a surface wave and a boundary wave.

The filter circuits 21 to 27 are disposed between the series arm resonators s1 and s2. In the present preferred embodiment, the filter circuits 21 to 27 preferably have a ladder configuration. That is, on a path connecting the series arm resonators s1 and s2, the filter circuits 22, 24, and 26 are connected in series. Each of the filter circuits 21, 23, 25, and 27 is connected between a corresponding node on the path and the ground. Each of the filter circuits 21 to 27 may have any of the circuit configurations of an LC resonant circuit, an elastic wave resonator, and a longitudinally coupled resonator as long as it has a filtering function. For example, the filter circuits 21 to 27 include a series arm resonator and a parallel arm resonator. Using a ladder configuration defined by the filter circuits 21 to 27 including a series arm resonator and a parallel arm resonator and the series arm resonators s1 and s2, a pass band is provided.

In the present preferred embodiment, a filter including the terminals m3 and m5 and the filter circuits 21 to 27 defines a second filter 20 and a filter including the terminals m2 and m6, the series arm resonators s1 and s2, and the second filter 20 defines a first filter 10. That is, the second filter 20 is included in the first filter 10, and the first filter 10 and the second filter 20 share the filter circuits 21 to 27.

The filter device 1 does not necessarily have to include the terminals m2, m3, m5, and m6. In this case, each of the first filter 10 and the second filter 20 does not include an input/output terminal, a portion including the filter circuits 21 to 27 defines the second filter 20, and a portion including the series arm resonators s1 and s2 and the filter circuits 21 to 27 defines the first filter 10.

The filter device 1 may include at least one filter circuit. For example, the filter device 1 may include only the filter circuit 21 or 22. In a case in which the filter device 1 includes a plurality of filter circuits, the connection between the filter circuits is not limited to that illustrated in FIG. 1 in which series circuits and parallel circuits are alternately connected, and may be a configuration in which series circuits are continuously connected or a configuration in which parallel circuits are continuously connected.

An element other than the series arm resonator s1 may be connected between the terminals m2 and m3. For example, on a path connecting the terminals m2 and m3, another series arm resonator, an inductor, or a capacitor may be provided. Between a node on the path and the ground, a parallel arm resonator, an inductor, or a capacitor may be connected. Between the terminals m5 and m6, an element other than the series arm resonator s2 may be similarly connected.

The switch SW1 may include three or more selection terminals. Between the three or more selection terminals, a series arm resonator or another element may be connected. The switch SW2 may similarly include three or more selection terminals. Between the three or more selection terminals, a series arm resonator or another element may be connected.

Switching performed by the switches SW1 and SW2 cause the filter device 1 to define and function as the first filter 10 or the second filter 20. For example, in a case in which the common terminal t1 is connected to the selection terminal t1a by the switch SW1 and the common terminal t2 is connected to the selection terminal t2a by the switch SW2, the filter device 1 defines and functions as the first filter 10. For example, in a case in which the common terminal t1 is connected to the selection terminal t1b by the switch SW1 and the common terminal t2 is connected to the selection terminal t2b by the switch SW2, the filter device 1 defines and functions as the second filter 20. In a case in which the filter device 1 defines and functions as the first filter 10, the series arm resonators s1 and s2 that are acoustic wave resonators define the first filter 10. Therefore, an insertion loss in the pass band of the filter device 1 is reduced or prevented and/or the steepness of an attenuation slope on the higher frequency side of the pass band is increased.

Next, the filter characteristic of the filter device 1 will be described with reference to FIG. 2.

Figure 2:
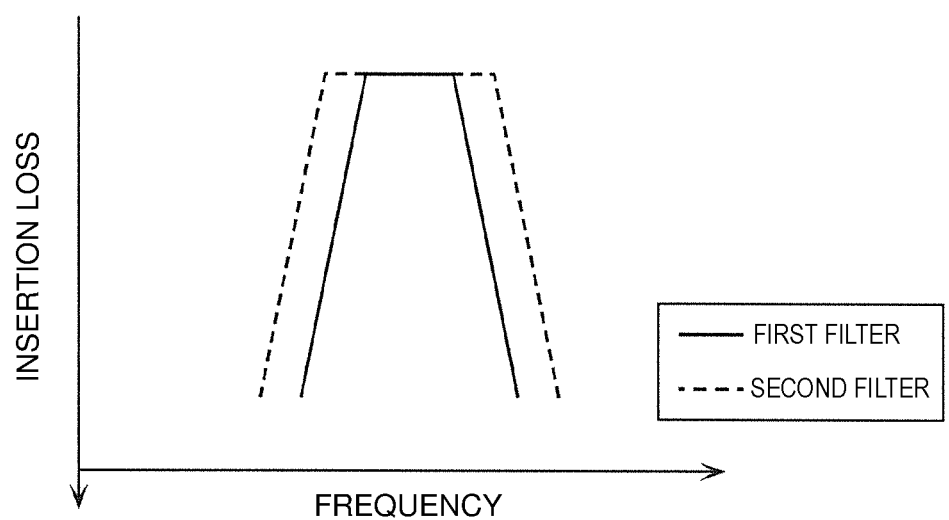
FIG. 2 is a diagram schematically illustrating the bandpass characteristics of a first filter according to a preferred embodiment of the present invention and a second filter according to a preferred embodiment of the present invention.

FIG. 2 is a diagram schematically illustrating the bandpass characteristics of the first filter 10 according to a preferred embodiment of the present invention and the second filter 20 according to a preferred embodiment of the present invention. Referring to FIG. 2, a solid line represents the bandpass characteristic of the first filter 10 and a broken line represents the bandpass characteristic of the second filter 20.

One of a pass band provided by at least one filter circuit (that is, the pass band of the second filter 20) and a pass band provided by the series arm resonators s1 and s2 and at least one filter circuit (that is the pass band of the first filter 10) is inside the other one of the pass bands. In the present preferred embodiment, as illustrated in FIG. 2, the pass band of the first filter 10 is inside the pass band of the second filter 20. For example, the pass band of the first filter 10 corresponds to LTE Band30Rx and the pass band of the second filter 20 corresponds to LTE Band40. For example, the pass band of the first filter 10 may correspond to LTE Band1Rx and the pass band of the second filter 20 may correspond to LTE Band66Rx.

Thus, multi-band communication is provided in frequency bands having a relationship such as the relationship between LTE Band30Rx and LTE Band40 or the relationship between LTE Band1Rx and LTE Band66Rx in which one of the frequency bands (for example, LTE Band40) includes the other one of the frequency bands (for example, LTE Band30Rx).

The filter device 1 preferably includes the switch SW2 and the series arm resonator s2, but does not necessarily include the switch SW2 and the series arm resonator s2.

Figure 3:
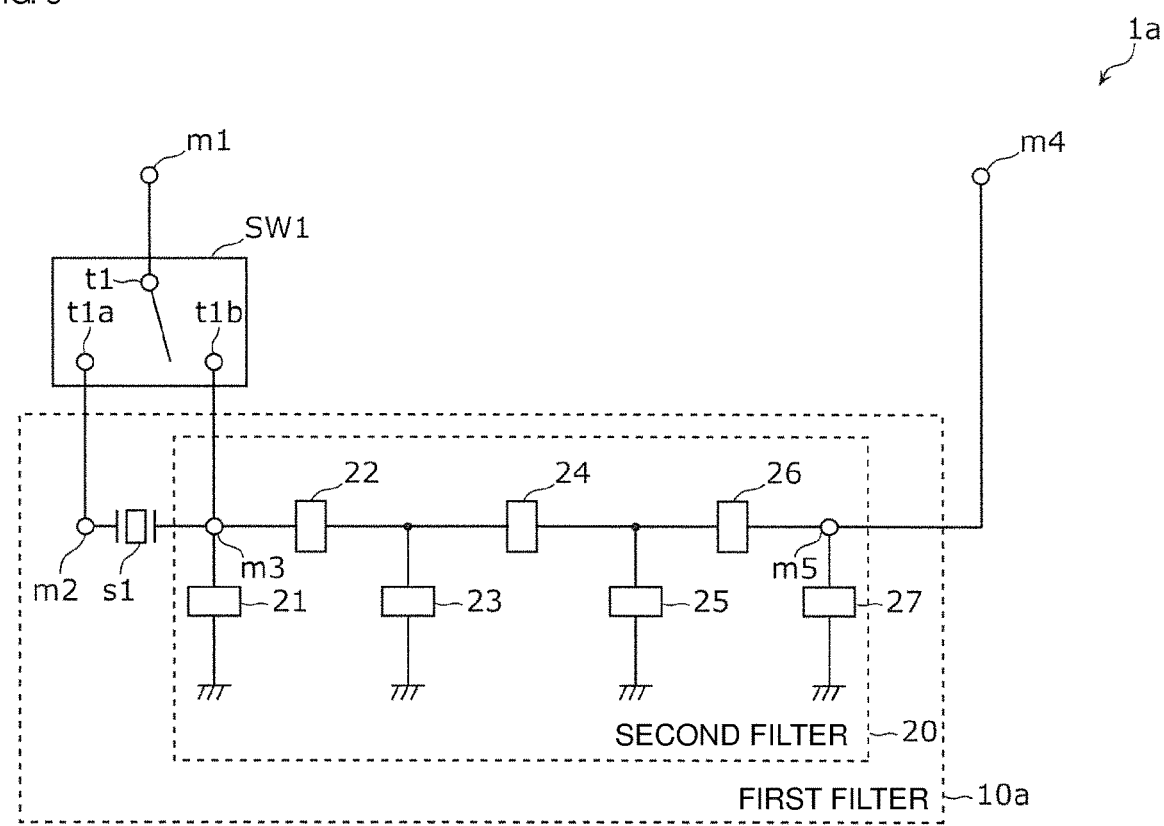
FIG. 3 is a diagram illustrating the circuit configuration of a filter device that is a modification of a preferred embodiment of the present invention.

FIG. 3 is a diagram illustrating the circuit configuration of a filter device 1a that is a modification of a preferred embodiment of the present invention.

As illustrated in FIG. 3, the filter device 1a differs from the filter device 1 in that it does not include the switch SW2, the series arm resonator s2, or the terminal m6. The remaining configuration is the same or substantially the same as that of the filter device 1, and the description thereof will be therefore omitted.

In this modification, a portion including the series arm resonator s1 and the filter circuits 21 to 27 defines a first filter 10a. Also in this modification, the first filter 10a and the second filter 20 share the filter circuits 21 to 27.

Switching performed by the switch SW1 causes the filter device 1 to define and function as the first filter 10a or the second filter 20. For example, in a case in which the common terminal t1 and the selection terminal t1a are connected by the switch SW1, the filter device 1a defines and functions as the first filter 10a. For example, in a case in which the common terminal t1 and the selection terminal t1b are connected by the switch SW1, the filter device 1a defines and functions as the second filter 20.

One of a pass band provided by at least one filter circuit (that is, the pass band of the second filter 20) and a pass band provided by the series arm resonator s1 and at least one filter circuit (that is, the pass band of the first filter 10a) is inside the other one of the pass bands.

Thus, the filter device 1a does not necessarily include the switch SW2 and the series arm resonator s2 on the side of one of the terminals m1 and m4 (the terminal m4 in this modification).

In the above description, switching performed by the switches SW1 and SW2 or the switch SW1 provides multi-band communication. However, multi-band communication may also be provided with, for example, a configuration illustrated in FIG. 4.

Figure 4:
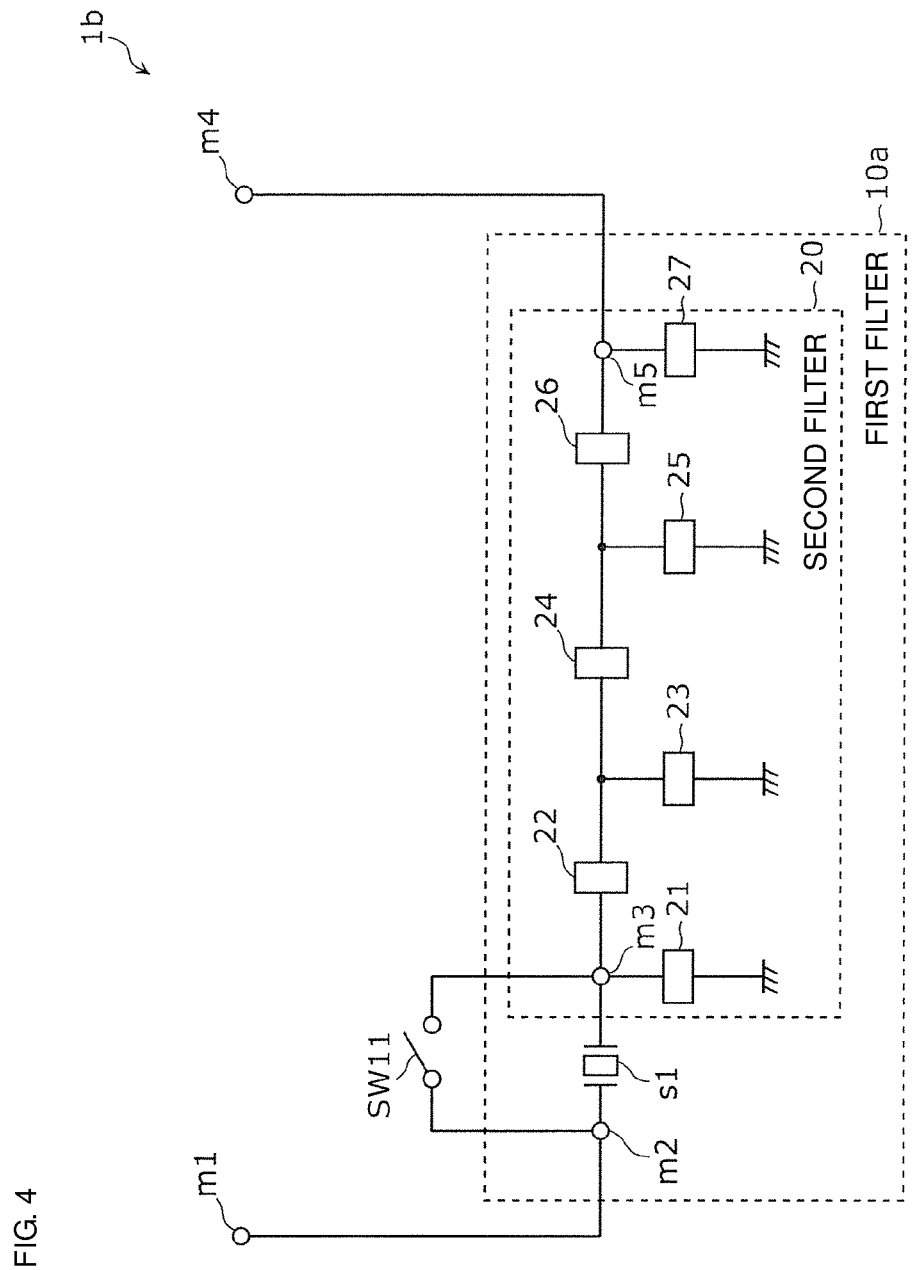
FIG. 4 is a diagram illustrating the circuit configuration of a filter device that is a comparative example.

FIG. 4 is a diagram illustrating the circuit configuration of a filter device 1b that is a comparative example. The filter device 1b differs from the filter device 1a in that it includes a single pole single throw (SPST) switch SW11, instead of the switch SW1.

For example, in a case where the switch SW11 is in a non-conductive state, the filter device 1b functions as the first filter 10a. For example, in a case in which the switch SW11 is in a conductive state, the series arm resonator s1 is short-circuited and the filter device 1b defines and functions as the second filter 20.

In order to cause the filter device 1a including the switch SW1 to define and function as the second filter 20, the common terminal t1 and the selection terminal t1b are connected and the series arm resonator s1 is open. As a result, the influence of the series arm resonator s1 is reduced. However, in order to cause the filter device 1b including the switch SW11 to define and function as the second filter 20, the switch SW11 is brought into a conductive state but the series arm resonator s1 is not open. The influence of the series arm resonator s1 is present.

Accordingly, in a preferred embodiment of the present invention, an SPST switch is not used and an SPnT (n is an integer greater than or equal to 2) switch is used as the switch SW1 (and the switch SW2).

The filter devices 1 and 1a according to a present preferred embodiment may be included in a multiplexer for a system using a larger number of bands.

Figure 5:
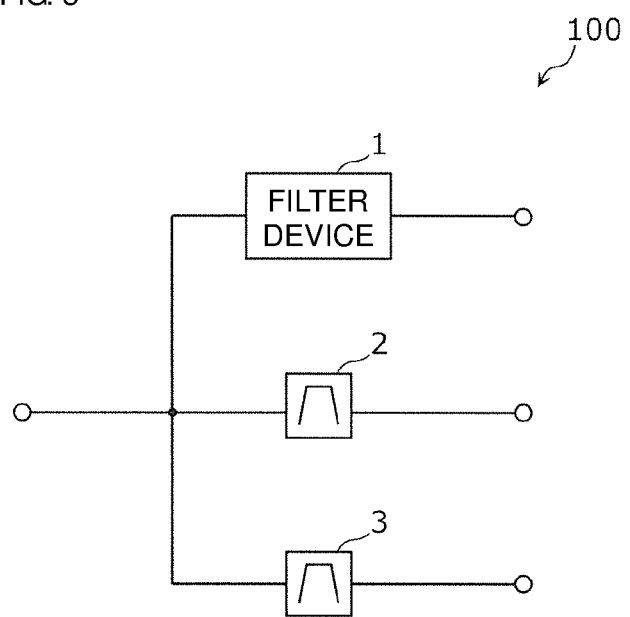
FIG. 5 is a diagram illustrating the circuit configuration of an exemplary multiplexer according to a preferred embodiment of the present invention.

FIG. 5 is a diagram illustrating the circuit configuration of an exemplary multiplexer 100 according to a preferred embodiment of the present invention.

As illustrated in FIG. 5, the multiplexer 100 includes a plurality of filters including the filter device 1. One input/output terminal of each of these filters is directly or indirectly connected in common. For example, the multiplexer 100 includes the filter device 1 and filters 2 and 3 each including one input/output terminal connected in common.

The filters 2 and 3 may be any filters such as band pass filters, high pass filters, low pass filters, and band elimination filters. The multiplexer 100 is a triplexer in the present preferred embodiment, but may be, for example, a duplexer or a quadplexer. Any number of filters may be connected in common. The multiplexer 100 may include the filter device 1a. For example, two or more of the filter device 1 (or the filter device 1a) and the filters 2 and 3 may be used at the same time in the multiplexer 100, so that carrier aggregation (CA) is performed.

A high frequency signal input to or output from the terminal m1 does not pass through the series arm resonator s1 but through the filter circuits 21 to 27 in a case in which the common terminal t1 is connected to the selection terminal t1b, which is connected to one end of the series arm resonator s1 (that is, between the series arm resonator s1 and the filter circuits 21 to 27), by the switch SW1. On the other hand, the high frequency signal passes through the series arm resonator s1 and the filter circuits 21 to 27 in a case in which the common terminal t1 is connected to the selection terminal t1a connected to the other end of the series arm resonator s1 by the switch SW1. Accordingly, switching performed by the switch SW1 causes the filter device 1a to define and function as the first filter 10a including the series arm resonator s1 and the filter circuits 21 to 27 or the second filter 20 including the filter circuits 21 to 27. In the first filter 10a, at least the series arm resonator s1 is added to the components in the second filter 20 and differs from the second filter 20 in this point. Accordingly, the first filter 10a and the second filter 20 have different pass bands and switching performed by the switch SW1 provides the multi-band communication of the filter device 1a. Since the first filter 10a and the second filter 20 share the filter circuits 21 to 27, the filter device is further reduced in size as compared with a case in which the first filter 10a and the second filter 20 are separately provided. As a result, both miniaturization and multi-band communication is provided.

Switching performed by the switch SW2 causes a high frequency signal input to or output from the terminal m1 to or not to pass through the series arm resonator s2. Switching performed by the switch SW2 therefore changes the number of elements through which the high frequency signal passes. As a result, frequencies that the filter device 1 support are able to be flexibly and markedly changed.

By including the filter device 1 or 1a in the multiplexer 100, a multiplexer that provides multi-band communication and is able to be miniaturized is provided.

The filter devices 1 and 1a according to preferred embodiments of the present invention and the multiplexer 100 according to a preferred embodiment of the present invention have been described. However, the present invention is not limited to the above-described preferred embodiments. The present invention also includes other preferred embodiments achieved by combining optional components and elements of the above-described preferred embodiments, modifications obtained by making various changes, which are conceived by those skilled in the art, to above-described preferred embodiments without departing from the spirit and scope of the present invention, and various apparatuses including the filter devices 1 and 1a according to preferred embodiments of the present invention and the multiplexer 100 according to preferred embodiments of the present invention.

The present invention may be widely applied to communication apparatuses, such as cellular phones, for example, as filter devices and multiplexers applicable to multi-band systems.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:
1. A filter device comprising:
a first input/output terminal;
a first switch that includes a first common terminal and a plurality of first selection terminals and that switches a connection of the first common terminal to one of the first selection terminals;

a first series arm resonator; and
at least one filter circuit; wherein
the at least one filter circuit is connected to one end of the first series arm resonator;
the first common terminal is connected to the first input/output terminal;
one of the first selection terminals is connected between the one end of the first series arm resonator and the at least one filter circuit; and
another one of the first selection terminals is connected to another end of the first series arm resonator.

2. The filter device according to claim 1, further comprising:
a second input/output terminal;
a second switch that includes a second common terminal and a plurality of second selection terminals and that switches a connection of the second common terminal to one of the second selection terminals; and
a second series arm resonator; wherein
the at least one filter circuit is connected between the first series arm resonator and one end of the second series arm resonator;
the second common terminal is connected to the second input/output terminal;
one of the second selection terminals is connected between the one end of the second series arm resonator and the at least one filter circuit; and
another one of the second selection terminals is connected to another end of the second series arm resonator.

3. The filter device according to claim 1, wherein one of a pass band provided by the at least one filter circuit and a pass band provided by the first series arm resonator and the at least one filter circuit is inside another pass band.

4. The filter device according to claim 2, wherein one of a pass band provided by the at least one filter circuit and a pass band provided by the first series arm resonator, the second series arm resonator, and the at least one filter circuit is inside another pass band.

5. The filter device according to claim 1, wherein the at least one filter circuit includes a series arm resonator and a parallel arm resonator.

6. The filter device according to claim 1, wherein the first switch includes two of the selection terminals.

7. The filter device according to claim 2, wherein the second switch includes two of the selection terminals.

8. The filter device according to claim 1, wherein the first switch is a single pole n-Throw, wherein n is an integer greater than or equal to 2.

9. The filter device according to claim 2, wherein the second switch is a single pole n-Throw, wherein n is an integer greater than or equal to 2.

10. The filter device according to claim 1, wherein the first switch is a field effect transistor made of one of gallium arsenide or a complementary metal oxide semiconductor.

11. A multiplexer comprising:
a plurality of filters including the filter device according to claim 1; wherein
one input/output terminal of each of the plurality of filters is directly or indirectly connected in common.

12. The multiplexer according to claim 11, further comprising:
a second input/output terminal;
a second switch that includes a second common terminal and a plurality of second selection terminals and that switches a connection of the second common terminal to one of the second selection terminals; and
a second series arm resonator; wherein
the at least one filter circuit is connected between the first series arm resonator and one end of the second series arm resonator;
the second common terminal is connected to the second input/output terminal;
one of the second selection terminals is connected between the one end of the second series arm resonator and the at least one filter circuit; and
another one of the second selection terminals is connected to another end of the second series arm resonator.

13. The multiplexer according to claim 11, wherein one of a pass band provided by the at least one filter circuit and a pass band provided by the first series arm resonator and the at least one filter circuit is inside another pass bands.

14. The multiplexer according to claim 12, wherein one of a pass band provided by the at least one filter circuit and a pass band provided by the first series arm resonator, the second series arm resonator, and the at least one filter circuit is inside another pass band.

15. The multiplexer according to claim 11, wherein the at least one filter circuit includes a series arm resonator and a parallel arm resonator.

16. The multiplexer according to claim 11, wherein the first switch includes two of the selection terminals.

17. The multiplexer according to claim 12, wherein the second switch includes two of the selection terminals.

18. The multiplexer according to claim 11, wherein the first switch is a single pole n-Throw, wherein n is an integer greater than or equal to 2.

19. The multiplexer according to claim 12, wherein the second switch is a single pole n-Throw, wherein n is an integer greater than or equal to 2.

20. The multiplexer according to claim 11, wherein the first switch is a field effect transistor made of one of gallium arsenide or a complementary metal oxide semiconductor.

* * * * *